United States Patent
Yiang et al.

(10) Patent No.: US 8,022,716 B2
(45) Date of Patent: Sep. 20, 2011

(54) DIELECTRIC BREAKDOWN LIFETIME ENHANCEMENT USING ALTERNATING CURRENT (AC) CAPACITANCE

(75) Inventors: Kok Yong Yiang, Santa Clara, CA (US);
Rick Francis, Sunnyvale, CA (US);
Amit P. Marathe, Sunnyvale, CA (US);
Van-Hung Pham, Milpitas, CA (US)

(73) Assignee: GLOBALFOUNDRIES Inc, Grand Cayman (KY)

( * ) Notice: Subject to any disclaimer, the term of this patent is extended or adjusted under 35 U.S.C. 154(b) by 129 days.

(21) Appl. No.: 12/506,837

(22) Filed: Jul. 21, 2009

(65) Prior Publication Data
US 2011/0018565 A1   Jan. 27, 2011

(51) Int. Cl.
*G01R 31/12* (2006.01)

(52) U.S. Cl. .......... 324/663; 702/58; 324/548; 324/554

(58) Field of Classification Search .................. 324/663
See application file for complete search history.

(56) References Cited

U.S. PATENT DOCUMENTS

| | | | | |
|---|---|---|---|---|
| 3,480,864 | A * | 11/1969 | Murphy | 324/762.07 |
| 5,625,288 | A * | 4/1997 | Snyder et al. | 324/750.06 |
| 6,133,746 | A * | 10/2000 | Fang et al. | 324/762.09 |
| 6,329,831 | B1 | 12/2001 | Bui et al. | |
| 6,632,691 | B1 * | 10/2003 | Howland | 438/17 |
| 6,777,957 | B1 | 8/2004 | Yang et al. | |
| 7,205,165 | B1 | 4/2007 | Salman et al. | |
| 7,340,360 | B1 | 3/2008 | Zhang et al. | |
| 7,589,551 | B1 * | 9/2009 | Yang et al. | 324/750.01 |
| 2003/0204820 | A1 * | 10/2003 | Asano et al. | 716/1 |
| 2004/0155240 | A1 * | 8/2004 | Howland et al. | 257/48 |
| 2009/0127611 | A1 * | 5/2009 | Park et al. | 257/316 |
| 2009/0167336 | A1 * | 7/2009 | La Rosa et al. | 324/763 |
| 2009/0267634 | A1 * | 10/2009 | Nada et al. | 324/769 |

OTHER PUBLICATIONS

HP 4155B/4156B Semiconductor Parameter Analyzer Product Note 4 Advantages over the HP 4145A/4145B, Hewlett-Packard, 1999, pp. 5-6.*
Hulbert, Pete and Yuegang, Zhao, "Introducing Pulsing into Reliability Tests for Advanced CMOS Technologies", Keithly Intrsuments, Inc, 2005, pp. 2-3, 8.*

* cited by examiner

*Primary Examiner* — Patrick J Assouad
*Assistant Examiner* — Vincent P Spinella-Mamo
(74) *Attorney, Agent, or Firm* — Ditthavong Mori & Steiner, P.C.

(57) ABSTRACT

A time-to-breakdown for a dielectric layer in a semiconductor device is determined based upon a sudden change in capacitance. An alternating voltage, greater in magnitude than an operating voltage of the device, is applied to the semiconductor device, capacitance is measured across the dielectric layer during the application of the voltage until a sudden change in capacitance occurs, thereby indicating a breakdown in the dielectric layer, and the breakdown time is scaled to the operating voltage.

19 Claims, 3 Drawing Sheets

DIELECTRIC BREAKDOWN LIFETIME ENHANCEMENT USING ALTERNATING CURRENT (AC) CAPACITANCE

TECHNICAL FIELD

The present disclosure relates to an improved method for determining time dependent dielectric breakdown of gate dielectrics and inter-layer dielectrics.

BACKGROUND

There is a constant drive within the semiconductor industry to increase the quality, reliability, performance, and throughput and to reduce the cost of integrated circuit devices, e.g., microprocessors, memory devices, and the like. This drive has resulted in improvement in the manufacture of semiconductor devices, e.g., transistors, as well as in the manufacture of integrated circuit devices incorporating such transistors. Reduction in defects in the manufacture of the components of a typical transistor lowers the overall cost per transistor as well as the cost of integrated circuit devices incorporating such transistors.

Improved performance capability of integrated circuit devices has been obtained by increasing the operating speed of transistors. Greater operating speed is related to decreasing the gate length of the transistors. However, decreases in gate length require scaling down of the entire device, thereby reducing the thicknesses of the gate dielectric (Gox) and the inter-layer dielectric (ILD).

To insure the reliability of the Gox and ILD layers, semiconductor manufacturers typically conduct several tests. One such test evaluates the qualities and capabilities of the dielectric layers by determining the time-dependent dielectric breakdown (TDDB) of the layers. The Gox or ILD is subjected to a constant (DC) voltage stress over time and its "time to fail" is determined. The time at which the Gox or ILD breaks down is measured by detecting when a sudden leakage current short occurs, as evidenced by an abrupt increase in leakage current.

However, integrated transistors and interconnection wires are typically operated by rapid activation and deactivation of components (on/off mode), in contrast to application of a constant DC voltage bias. A much greater component lifetime should be expected than would be indicated by the above described TDDB test because less stress is imposed on the transistor with alternating on/off application of voltage. Thus conventional test setups that determine leakage short detection by application of a DC voltage present disadvantages.

A current solution is illustrated in FIG. 1. A mechanical switch is used to connect, alternately, between two different voltage levels, V1 and V2. For example, a V2 level of +20V may be applied to the circuit between alternate applications of ground (V1). During rapid switching between V1 and V2, AC oscillation occurs and leakage current cannot be measured. The test requires a period 101 in which constant DC voltage is applied, illustrated at the V2 level, inserted between periods 103 and 105 of rapid voltage switching. During the time period 101, which is typically in the order of about ten seconds, leakage current is sensed.

This method has several disadvantages. The manual voltage switching severely limits the AC frequency to a maximum of about 100 kilohertz (kHz), which is significantly lower than the typical operating frequency of about one gigahertz (GHz) for the semiconductor elements. Also, the manual voltage switching creates a detectable level of voltage overshoot. Moreover, any Gox or ILD breakdown that may occur during the AC stress periods 103 and 105 would not be detected at the time of breakdown, as sensing occurs during the application of constant DC voltage, period 101. The time to fail becomes subjective, since it depends on the duration set for the unsensed AC stress. If the AC stress period is set too long, the periodicity of leakage sense becomes very low, which affects the time resolution of the measurement and risks missing an important breakdown event during period 103 or period 105. If the AC stress is set too short, the 10 second DC sense duration becomes dominant and the AC component becomes less significant and, thereby, meaningless.

As leakage current is not measured while AC voltage bias is being applied, the degree of improvement of this method, compared with the constant DC TDDB method is speculative. With aggressive semiconductor scaling in terms of rapidly reducing the Gox and ILD layers, TDDB lifetime is currently one of the most critical limiting factors in pushing the operating limits of semiconductor chip products.

A need therefore exists for a method for more accurately determining the TDDB of Gox and ILD layers under conditions that mimic operating conditions, including application of AC voltage at a relatively high frequency.

SUMMARY

By applying an alternating voltage to a semiconductor device having a dielectric layer and measuring capacitance across the dielectric layer during the application of the alternating voltage, a time-to-breakdown for the dielectric layer may be determined based upon detection of a sudden change in capacitance. The alternating voltage may be higher than an operating voltage of the semiconductor device, i.e., about 1 V for a computer chip, and may be applied with a frequency of about 1 MHz. The dielectric layer may be an interlayer dielectric or a gate oxide layer. The alternating voltage may range from 0 V to a peak voltage. For an interlayer dielectric, the peak voltage may be about 10 V to about 40 V, i.e., about 10 V to about 30 V, such as about 20 V. For a gate oxide layer about 10 Å in thickness, the peak voltage may range from about 3V to about 4 V.

Two different alternating voltages, for example 20 V and 10 V, each greater than the operating voltage of the device, may be applied, and the capacitance measured and the time to breakdown determined for each of the two voltages. Then, the determination of a time-to-breakdown may be accomplished by scaling the breakdown times for the two different alternating voltages to the operating voltage of the device.

An apparatus used for determining time-to-breakdown for a dielectric layer may include a pair of probes connected to pads on a semiconductor device under test, i.e., to conductors on first and second sides of the dielectric layer, a probe station connected to the probes, and a parametric analyzer connected to the probe station, i.e., by triaxial cables, wherein the parametric analyzer applies alternating current waveforms to the semiconductor device and analyzes changes in capacitance across a dielectric layer of the semiconductor device during the application of the alternating current waveforms. The parametric analyzer determines a time-to-breakdown for the dielectric layer based upon a sudden change in capacitance.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments.

Figure 2:
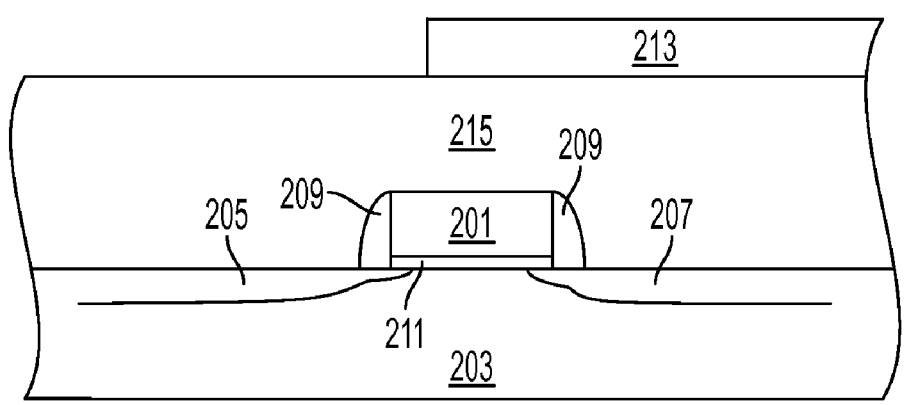
FIG. 2 illustrates a conventional transistor.

FIG. 2 schematically illustrates a conventional transistor. A gate electrode 201 is formed on substrate 203 between source and drain regions 205 and 207. Sidewall spacers 209 are formed on each side of gate electrode 201. Between gate electrode 201 and substrate 203 is a thin gate dielectric 211, Gox. Between the transistor and a metal 1 pattern 213, is ILD 215. Other ILDs may be formed, for example, between metal 1 pattern 213 and a metal 2 pattern and between the metal 2 pattern and a metal 3 pattern in other portions of the integrated circuit.

Figure 1:
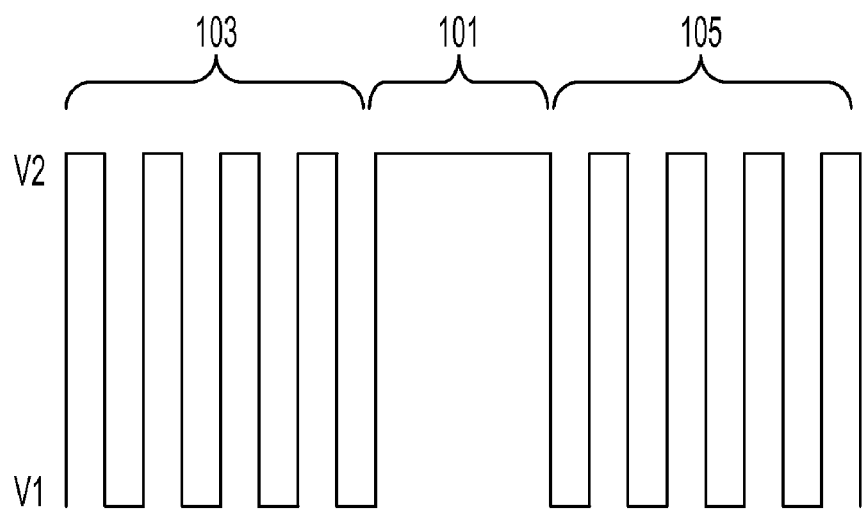
FIG. 1 schematically illustrates a prior art method for determining time-dependent dielectric breakdown.

The present disclosure addresses and solves the problem of accurately determining the TDDB of Gox 211 and ILD 215, for example, under conditions that mimic operating conditions, such as while applying an AC voltage at a relatively high frequency. Instead of relying on the conventional leakage current sense method as described with respect to FIG. 1, the present disclosure exploits the principles of capacitance measurement to detect dielectric breakdown while a high-frequency AC stress is applied. No disruptive DC time window is required through the continuous AC stress.

Capacitance measurement is done by applying an oscillating AC voltage ($V_{OSC}$) over a DC bias ($V_{Bias}$). This is based on the well-known equation, Q=CV, where a derivative on both sides of the equation yields:

$$I = \frac{dQ}{dt} = C\frac{dV}{dt} + V\frac{dC}{dt}$$ Eq. 1 where I and dQ/dt equal the leakage current, C equals the calculated capacitance, $V_{osc}$ (and, therefore, $dV_{OSC}/dt$) is known, $V_{Bias}$ is known, and dC/dt equals zero. Any sudden change in leakage current i, due to dielectric breakdown, is correspondingly reflected in a sudden change in measured capacitance, C. Since the capacitance can be constantly sensed while $V_{Bias}$ and $V_{osc}$ are being applied, any sudden capacitance change, indicating dielectric breakdown, can be detected in real time and under very high time resolution.

Figure 3:
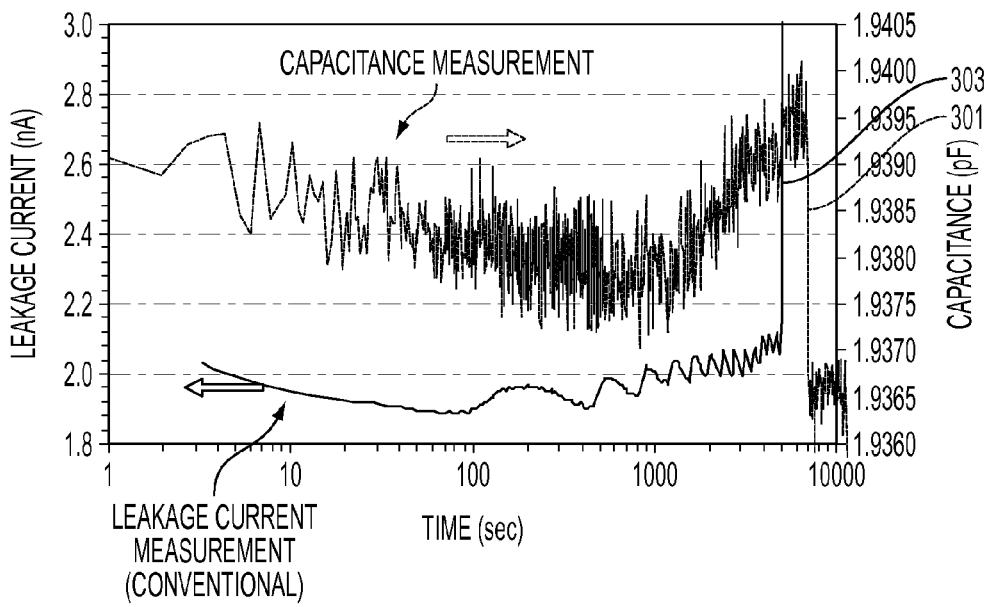
FIG. 3 shows experimental data illustrating that capacitance measurement is capable of detecting dielectric breakdown.

FIG. 3 shows experimental data comparing detection of dielectric breakdown by capacitance measurement (the upper curve) with detection of dielectric breakdown by the conventional leakage current measurement (the lower curve). For the conventional method in the experiment, a constant voltage of 11 V is applied. For the capacitance measurement, a very small oscillating voltage, $V_{OSC}$, equal to 0.025 V is applied over a DC $V_{Bias}$ of 11 V at a frequency of 1 MHz and a temperature of 100° C. The applied voltages mimic the DC voltage stress of the conventional method, but include a slight oscillation in order to allow measurement of the capacitance. The frequency is comparable to operating conditions. The very small range of measured capacitance demonstrates the high sensitivity (detectability) to dielectric breakdown. The data from the two curves illustrates that capacitance measurement is capable of detecting dielectric breakdown, as a sudden change in measured capacitance (a discontinuity indicated by the vertical line at 301) occurs at about the same time as the change in measured leakage current (a discontinuity indicated by the vertical line at 303). The subtle change in capacitance during stress also gives valuable information into the analytical physics (ILD "thinning") which leads to final catastrophic breakdown.

Figure 4:
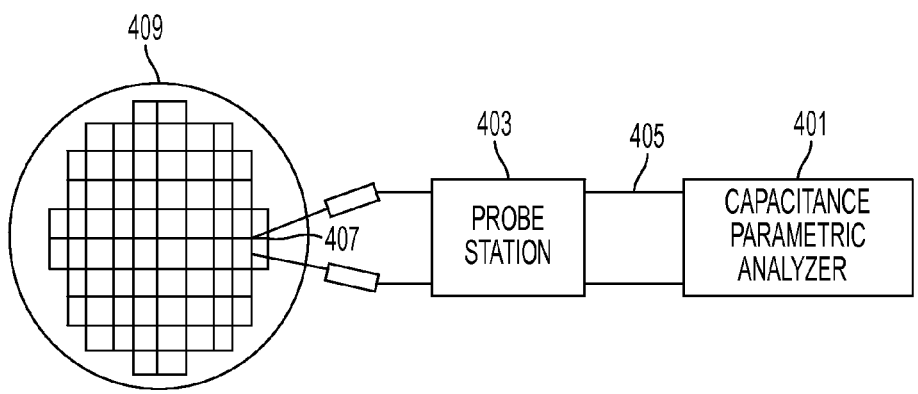
FIG. 4 schematically illustrates a testing apparatus, according to an exemplary embodiment.

FIG. 4 schematically illustrates a testing apparatus, according to an exemplary embodiment. Capacitance parametric analyzer 401 is connected to probe station 403 via triaxial cables 405. Probe station 403 is connected to pads 407 on the structure for test, 409. Parametric analyzer 401 applies an AC waveform, and measures the capacitance between the two test pads 407.

The dielectric under test may be stressed between about 20 V and ground in a first test and between about 10 V and ground in a second test. From the results of the two tests, a breakdown time of the dielectric under normal operating conditions, i.e., between about 1 V and ground for a computer chip or about between about 2.5 V or 3 V and ground for I/O signals on interconnect lines, may be estimated by scaling. The particular waveform applied depends on the type of material under test, the thickness of the material, and the desired rate of failure during the test. For example, a gate oxide that is about 10 angstroms (Å) in thickness may be stressed at about 3 V to 4 V. On the other hand, an ILD about 0.5 microns (μ) in thickness between interconnect metals (with a spacing of about 0.3μ to about 0.4μ for 45 nanometer (nm) technology) may be stressed up to about 30 V to 40 V, i.e., about 20 V or 25 V.

Figure 5:
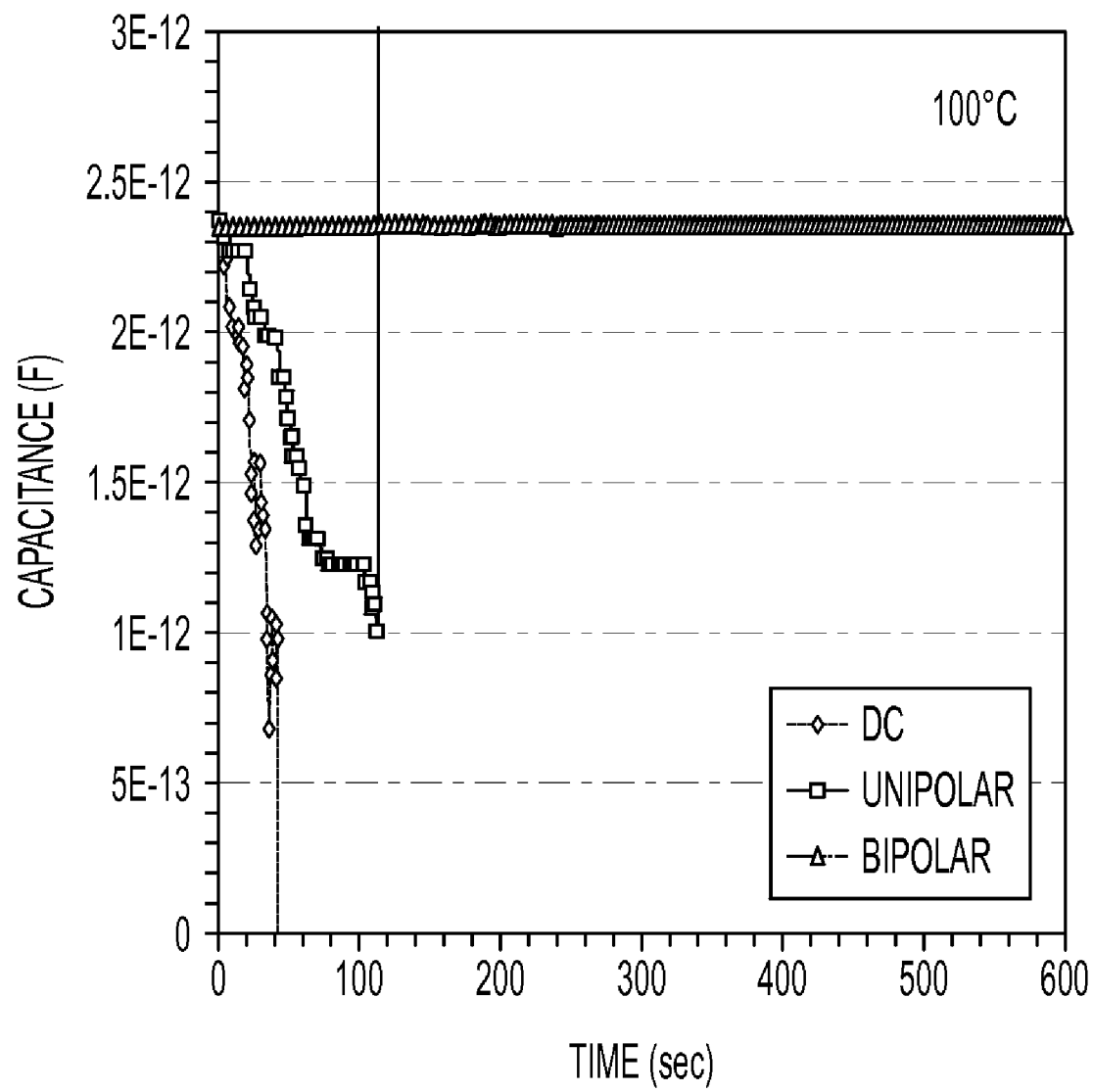
FIG. 5 shows capacitance measurement results in three different modes: DC, unipolar, and bipolar.

Unipolar (0 to +$V_{peak}$) and bipolar (-$V_{peak}$ to +$V_{peak}$) capacitance stressing can be achieved by varying the $V_{Bias}$ and $V_{OSC}$ levels. FIG. 5 shows capacitance measurement results in three different modes: DC, unipolar, and bipolar. All three samples started with the same capacitance, about 2.35E-12 farads (F), and at the same temperature of 100° C. As illustrated in FIG. 5, the application of a DC voltage (of 13.5 V) caused a breakdown at about 40 seconds, the application of a unipolar AC voltage (oscillating between 13.5 V and ground) caused a breakdown at about 100 seconds, and the application of a bipolar AC voltage (oscillating between +13.5 V and −13.5V) caused no breakdown even after 600 seconds. The systematic improvement in TDDB lifetime, from DC to unipolar to bipolar, can easily be quantified and used in product lifetime projections.

Embodiments of the present disclosure can achieve several technical effects, including allowing uninterrupted, real AC stress which can be sensed for dielectric breakdown in very high time resolution. The applied AC frequency can be very high and is only limited by the frequency limits of the test system, which is impossible using conventional methods. The increase in lifetimes demonstrated by AC detection can be used to push the limits of both projected lifetimes for products having different operating frequencies and also operating frequency (overclocking) of a certain product while still guaranteeing a product lifetime. The present disclosure enjoys industrial applicability in all semiconductor related products.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   applying an alternating voltage to a semiconductor device formed with a dielectric layer;
   measuring capacitance across the dielectric layer during application of the alternating voltage; and
   determining a time-to-breakdown for the dielectric layer based upon a discontinuity in the measured capacitance.

2. The method according to claim 1, wherein the alternating voltage is applied at a frequency of about 1 megahertz.

3. The method according to claim 1, wherein the magnitude of applied alternating voltage is higher than the normal operating voltage of the semiconductor device.

4. The method according to claim 1, wherein the applied voltage alternates between 0 volts and a peak voltage level.

5. The method according to claim 4, wherein the dielectric layer comprises an interlayer dielectric.

6. The method according to claim 5, wherein the peak voltage level is in a range from about 10 V to about 40 V.

7. The method according to claim 6, wherein the peak voltage level is in a range from about 10 V to about 30 V.

8. The method according to claim 7, wherein the peak voltage level is about 20 V.

9. The method according to claim 4, wherein the dielectric layer comprises a gate oxide layer.

10. The method according to claim 9, wherein the thickness of the dielectric layer is about 10 Å.

11. The method according to claim 10, wherein the peak voltage level is in a range from about 3 V to about 4 V.

12. The method according to claim 3, wherein the semiconductor device comprises a computer chip, and the normal operating voltage of the computer chip is about 1 V.

13. The method according to claim 1, wherein the applying step comprises:
   applying a first alternating voltage to the device, the first alternating voltage being greater in magnitude than the normal operating voltage of the device; and
   applying a second alternating voltage to the device after the measuring step, the second alternating voltage being different in magnitude from the magnitude of the first alternating voltage and greater in magnitude than the normal operating voltage of the device.

14. The method according to claim 13, further comprising a second measuring step during the application of the second alternating voltage.

15. The method according to claim 14, wherein the determining step comprises scaling the breakdown times for the first and second alternating voltages to the operating voltage of the semiconductor device.

16. The method according to claim 15, wherein the magnitude of the first applied voltage is about 20 V and the magnitude of the second applied voltage is about 10 V.

17. An apparatus comprising:
   a pair of probes connected to pads on a semiconductor device under test;
   a probe station connected to the probes; and
   a parametric analyzer connected to the probe station;
   wherein said parametric analyzer is configured to apply alternating current waveforms to the semiconductor device and to analyze changes in capacitance across a dielectric layer of the semiconductor device during the application of the alternating current waveforms and to determine a time-to-breakdown for the dielectric layer based upon a discontinuity in capacitance.

18. The apparatus according to claim 17, further comprising triaxial cables coupling the probe station to the parametric analyzer.

19. A method comprising:
   providing a semiconductor device having a dielectric layer;
   connecting probes to conductors on first and second sides of the dielectric layer;
   applying a first alternating voltage, greater in magnitude than a normal operating voltage of the semiconductor device, to said probes;
   measuring capacitance across the dielectric layer during the application of the first alternating voltage;
   determining a first time-to-breakdown for the dielectric layer based upon a first discontinuity in capacitance;
   applying a second alternating voltage, greater in magnitude than the normal operating voltage of the semiconductor device and different from the magnitude of the first alternating voltage, to said probes;
   measuring capacitance across the dielectric layer during the application of the second alternating voltage;
   determining a second time-to-breakdown for the dielectric layer based upon a second discontinuity in capacitance;
   scaling the first and second breakdown times for the first and second alternating voltages to the operating voltage of the semiconductor device.

* * * * *